United States Patent
Füsser et al.

[19]

[11] Patent Number: 6,054,719

[45] Date of Patent: *Apr. 25, 2000

[54] COMPOSITE STRUCTURE OF AN ELECTRONIC COMPONENT

[75] Inventors: Hans-Jürgen Füsser, Gerstetten-Dettingen; Reinhard Zachai, Günzburg; Tim Gutheit, Ulm, all of Germany

[73] Assignee: DamilerChrysler AG, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/639,104

[22] Filed: Apr. 22, 1996

Related U.S. Application Data

[63] Continuation-in-part of application No. 08/432,859, May 2, 1995, Pat. No. 5,656,828.

[30] Foreign Application Priority Data

Apr. 20, 1995 [DE] Germany ............................ 195 14 546

[51] Int. Cl.$^7$ .................................................. H01L 29/06
[52] U.S. Cl. ................................. 257/14; 257/77
[58] Field of Search ......................................... 257/14, 77

[56] References Cited

U.S. PATENT DOCUMENTS

| | | | |
|---|---|---|---|
| 4,314,873 | 2/1982 | Wieder et al. ........................... | 156/610 |
| 4,996,570 | 2/1991 | Van Houten et al. ..................... | 357/22 |
| 5,302,838 | 4/1994 | Roenker et al. .......................... | 257/14 |
| 5,336,923 | 8/1994 | Geddes et al. ........................... | 257/596 |
| 5,435,264 | 7/1995 | Santiago et al. ......................... | 117/92 |
| 5,486,705 | 1/1996 | Inoue et al. .............................. | 257/24 |
| 5,493,136 | 2/1996 | Matsuzuki et al. ...................... | 257/287 |
| 5,562,769 | 10/1996 | Dreifus et al. ............................ | 117/86 |
| 5,662,965 | 9/1997 | Deguchi et al. ......................... | 427/249 |

OTHER PUBLICATIONS

Tessmer et al High Temperature Operation of Polycrystalline Diamond Field Effect Transistors IEEE ED 14, 66(Feb. 1993).

*Primary Examiner*—Olik Chaudhuri
*Assistant Examiner*—Douglas A. Wille
*Attorney, Agent, or Firm*—Evenson, McKeown, Edwards & Lenahan, P.L.L.C.

[57] ABSTRACT

The invention relates to a composite structure for an electronic component with an undoped diamond layer, at least one side of which is covered by a doped non-diamond layer, arranged on a growth substrate. The diamond layer has a thickness of less than 0.5 μm. In addition, the conduction and/or valence bands of the diamond layer and the nondiamond layer exhibit such a band discontinuity that charge carries from the doped non-diamond layer which are excited optically and/or thermally, for example, can be drawn, with a reduction of their potential energy, into the valence and/or conduction band of the undoped diamond layer. This configuration causes a potential well to exist in the area of the diamond layer, at least in one direction, with a quantizing effect for the charge carriers drawn into the diamond layer.

11 Claims, 4 Drawing Sheets

COMPOSITE STRUCTURE OF AN ELECTRONIC COMPONENT

This application is a continuation-in-part of application Ser. No. 08/432,859, filed May 2, 1995 now U.S. Pat. No. 5,656,828.

BACKGROUND AND SUMMARY OF THE INVENTION

The invention relates to an electronic component with a semiconductor composite structure in which a doped semiconductor layer is in proximity to an undoped diamond layer.

German Patent Document DE-P 44 15 600.6 (not previously published) discloses a hetero-epitaxial composite structure in which an undoped diamond layer deposited by chemical vapor deposition (CVD) is provided with charge carriers by an adjacent doped semiconductor layer. Such introduction of charge carriers into the undoped diamond layer is achieved by the fact that a band discontinuity exists at the transition between the semiconductor layer and the diamond layer, so that charge carriers from the doped semiconductor layer pass into the undoped diamond layer. In this manner, diamond coatings can effectively be n-doped, especially with the aid of n-doped C-BN (cubic boronitride), because due to the band discontinuity at the middle boundary surface between the diamond coating and the n-doped C-BN layer, charge carriers from the C-BN layer flow into the diamond layer. It would of course be desirable to further increase the mobility of the charge carriers in the diamond layer.

Accordingly, an object of the present invention is to provide a semiconductor composite structure of the type described above, which provides improved mobility of charge carriers in the undoped diamond layer.

This and other objects and advantages are achieved by semiconductor composite structure, in which the undoped diamond layer has a thickness in a range of from 0.001 to 0.5 $\mu$m (preferably less than 0.1 $\mu$m, and ideally less than 0.05 $\mu$m), and has a band discontinuity at the boundary surface on both sides thereof. Due to the band discontinuity that is necessarily present at the boundary surface between the coatings (that is, between the semiconductor coating and the diamond coating), charge carriers generated optically and/or thermally, which are normally present in the doped coating (s), enter into the diamond layer's valence and/or conductivity band. The latter thus forms a "potential well" with quantizing for these charge carriers, as shown, for example, in FIG. 3. On account of the quantizing effects with respect to the charge carriers, it is possible with the composite structure of the invention to produce fast semiconductor components.

Due to the thinness of the undoped diamond layer, as discussed in greater detail hereinafter, the course of the band edge of the composite structure forms a so-called unidimensional potential well for the charge carriers that have flowed down into the diamond coating, at the interface with the adjacent layer or layers that dope the diamond layer. The "walls" of the potential well, formed by the band discontinuities (that is, the sharp increase in the energy level of the conduction band in the diamond layer at its interfaces with the two adjacent layers), lock in the charge carriers. Since the charge carriers in the diamond layer especially are able to assume only one energy state, at least discrete energy state, the scatter of the charge carriers is a least reduced, so that their mobility is increased.

For better comprehension, this mechanism will be described below by way of example with the aid of one especially useful C-BN/diamond/C-BN layer structure, in which the two n-doped C-BN layers are deposited adjacent an undoped diamond layer.

The C-BN layers which are disposed on both sides of the diamond layer, have a greater band energy gap than does the diamond layer. As the course of the band edge is formed, the band boundaries level out according to their particular Fermi energy level. Since the Fermi energy level of the C-BN layer is nearer to the conductivity band than the valence band of the undoped C-BN layer due to the n-doping, and since the band gap of the diamond layer is smaller than that of the C-BN layer, the result is a band discontinuity at the transition from the diamond layer to each C-BN layer. As a result, at least some of the charge carriers flow out of the C-BN layer into the diamond layer.

Since, according to the invention, the band edge in the area of the diamond layer has a shape that is at least similar to a potential well for the charge carriers in quantum physics, the energy levels of the charge carriers within the potential well are far enough apart, so that in the ideal case, only one state is possible in quantum mechanics for the charge carriers in the potential well. Due to this circumstance the probability of collision is low, so that the mobility of the charge carriers in the diamond layer is increased.

Furthermore, the probability of scatter is very low due to the suggested type of doping, since the doping atoms are spatially separated from the charge carriers situated in the potential well.

Furthermore, because the diamond layers of semiconductor composite structures of this type need not be doped, the associated problems of reproducibility, additional contamination, disturbance points for displacements and the like are at least decreased. Thus, ionized charge carrier bodies cannot act, or act only to a small extent, as scattering centers for the charge carriers in the active diamond layer. It has further proven to be advantageous that in semiconductor composite structures of this type, n-doping, as well as p-doping, is possible in d simple and inexpensive manner.

Other objects, advantages and novel features of the present invention will become apparent from the following detailed description of the invention when considered in conjunction with the accompanying drawings.

DETAILED DESCRIPTION OF THE DRAWINGS

Figure 1:
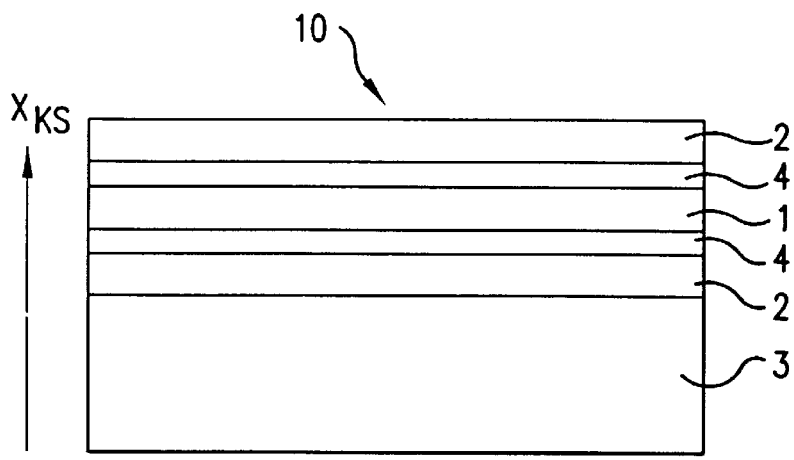
FIG. 1 is a section through a simple composite structure having five layers arranged on a growth substrate.

In FIG. 1 there is represented a composite structure 10 of a so-called "single quantum well (SQW)" with five layers 1, 2 and 4, which are deposited on a growth substrate 3 in the following order (beginning from the growth substrate 3): a doped nondiamond layer 2, an intermediate layer 4, an undoped diamond layer 1, another intermediate layer 4, and finally a doped layer 2. The deposition of layers 1, 2 and 4 on the growth substrate 3 is desirably performed, as in all the embodiments that follow, by CVD (chemical vapor deposition) and/or MBE (molecular beam epitaxy) and/or other variants of these epitaxial processes. (See, for example, German Patent Document DE 42 33 085 A1.)

The doped layer 2 can generally have a single component (such as Si, Ge or the like), two components (binary systems such as InP, GaAs, etc., for example), or three and more components (ternary or quaternary systems such as InGaAsP, or the like). In selecting the doped layer 2 it is useful to look for systems which have an acceptable lattice fit with the growth substrate 3 which expediently may have a (1, 0, 0) orientation in the Miller indices.

A good direct lattice match means that the lattice constant of the doped layer 2 differs only slightly from the lattice constant of the growth substrate 3. The size of the mismatch which is acceptable depends on the materials used; in general, however, it should be less than and advantageously less than 0.1%. Alternatively, a modified lattice match can exist between the doped layer 2 and the growth substrate 3. Generally, a modified lattice match means that the difference between an integral multiple of the lattice constant of the first material and integral multiple of the lattice constant of the second material is less than 20%, (preferably less than 10%, and ideally less than 1%), of the integral multiple of the one material.

The integral multiple of the lattice constants may be the same for the respective lattice constants of the doped layer 2 and the growth substrate 3, so that in this limiting case a simple, direct lattice match exists. On the other hand, the integral multiples can be different for the particular lattice constant. In the latter case, it is advantageous if the multiples of the lattice constants are less than 10, and preferably less than 5. One advantageous ratio in this case is a 2:3 ratio.

In order to diminish any lattice mismatch between the doped semiconductor layer 2 and the subsequently deposited undoped diamond layer 1, an intermediate layer 4 is deposited on the doped semiconductor layer 2. The intermediate layer 4 may be an alloy, which has crystallographically regular alloy lattice with a diamond, calcium fluoride or zinc blend structure, and in which the composition of the alloy varies in the direction of the thickness of the layer (that is, it varies with distance from the semiconductor layer).

A process for creating such an intermediate layer is described hereinafter. Such change in the composition of the alloy across its thickness makes it possible to vary the lattice constant of the alloy within wide limits. Through this large variation of the lattice constant of the alloy lattice, a direct or modified lattice fit between the semiconductor layer 2 and the diamond layer 1 can be realized in a simple manner by means of an intermediate layer 4 of this type. An alternative to the alloy is an intermediate layer 4 of cobalt disilicide ($CoSi_2$) which has a lattice mismatch smaller than 1% relative to a semiconductor layer 2 formed of C-BN, and an almost perfect 2:3 match to diamond.

On the diamond layer 1, which has a thickness in the range of 0.001 to 0.5 $\mu$m (preferably less than 0.1 $\mu$m, and ideally less than 0.05 $\mu$m) and is deposited substantially undoped (except for unavoidable impurities), there is deposited another intermediate layer 4 onto which a doped layer 2 is applied. The material composition of the intermediate layer 4 and doped layer 2 is adjusted relative to the diamond layer 1 so that, due to a discontinuity of the conduction bands between these layers, optically and/or thermally activated charge carriers of the preferably n-doped layer flow through the intermediate layer 4 into a conduction band of the undoped diamond layer 1, with a decrease of their potential energy. (See, for example, U.S. Pat. No. 5,117,267 and German Patent Document DE PS 42 33 085 A1) Thus, the diamond layer 1 of this composite structure becomes an n-type layer, without direct n-doping.

It is also possible to produce composite structures 10 with p-type diamond layers 1 without direct doping in the same manner. For this purpose, the material composition of the intermediate layer 4 and doped layer 2 must be adjusted so that the discontinuity of the valence bands causes optically and/or thermally activated charge carriers of the p-doped layer 2 to flow through the intermediate layer 4 into the valence band of the undoped diamond layer 1 with a loss of potential energy, producing a p-type diamond layer 1.

Figure 3:
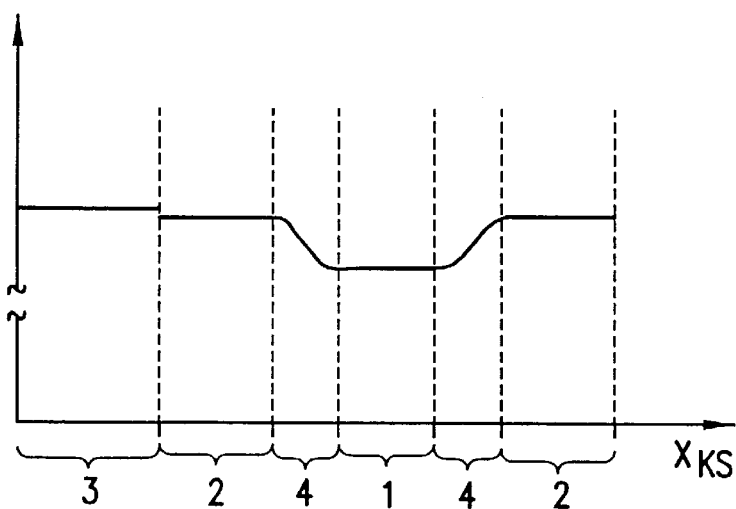
FIG. 3 is a graphic representation of the lattice constants of the composite structure of FIG. 1, along an axis which extends in the direction of the thickness of the layers thereof.

The semiconductor composite structure 10 having a single quantum well such as the embodiment of FIG. 1 can be used to produce electronic components such as diodes which emit light in the blue range, or field-effect transistors (FET's), among other things. (See, for example, FIG. 2, discussed hereinafter.) In such applications, the high thermal conductivity of the diamond layer 1, and especially its high charge carrier mobility are of great advantage FIG. 3 is a conceptual diagram which depicts the lattice constants $a_1$ of the composite substrate 10 along an axis parallel to the growth of the layers, illustrated by an arrow in FIG. 1 The layer thickness $x_{KS}$ of the composite structure 10 is plotted along the abscissa, and the corresponding lattice constants $a_1$ of the layers 1, 2 and 4 of the composite structure 10 are shown along the ordinate. (This diagram, which is not drawn to scale, should be considered as a conceptual depiction, and not precise.) The lattice constant of the growth substrate 3 is shown at the left, followed by the slightly lower lattice constant of the doped layer, which should differ from that of the growth substrate 3 by less than 1%, so as to make possible an acceptable epitaxial growth of the doped layer 2. The doped layer 2 is followed by an intermediate layer 4 whose lattice constant varies in the direction of its thickness as shown in FIG. 3, approaching the lattice constant of the diamond at the junction with the diamond layer 1. If the lattice constant of the diamond is achieved within close tolerances, (preferably less than 3%, and ideally less than 1%), the undoped diamond layer is deposited so that the composite structure 10, in this area pertaining to the diamond layer 1, has the lattice constant of crystalline diamond.

After the diamond layer 1 (which has a layer thickness in the range of 0.001 to 0.5 $\mu$m, and ideally less than 0.05 $\mu$m), there is another intermediate layer 4 whose lattice constant this time, however, varies from the diamond value to the value of the doped layer 2, so that the latter can be deposited expitaxially thereon.

Figure 4:
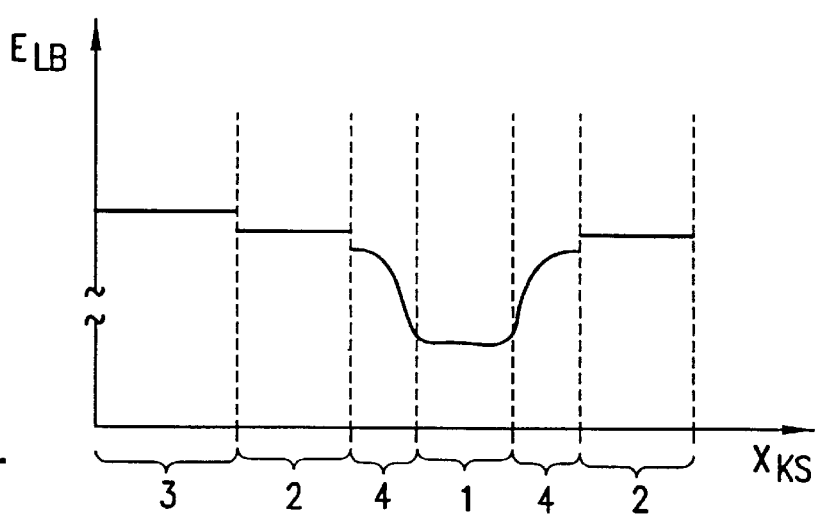
FIG. 4 is a graph of the conductance band edge of the composite structure of FIG. 1, along the same axis as FIG. 3.

FIG. 4 is an idealized representation of a conduction band edge in the case of an n-doped semiconductor composite structure 10 of the type shown in FIG. 1. (That is, the curve represents the lower limit or "edge" of the conduction band, which lies in the area above the curve.) In FIG. 4, the layer thickness $x_{KS}$ of the composite structure 10 is plotted along the abscissa, and the value $E_{LB}$ of the energy level of the conduction band edge is shown along the ordinate. As can be seen, the conduction band of the growth substrate 3 has the highest energy level, followed by that of the doped layer 2 (whose energy level is set slightly lower) adjacent thereto. In the intermediate layer 4 the conduction band edge exhibits a band discontinuity which leads to a lower energy level in the diamond layer 1. After the diamond layer 1, the conduction band energy level within the next adjacent intermediate layer 4 rises again to the level of the doped layer 2. As can be seen from this greatly enlarged representation of the conduction band edge in the area of the diamond layer 1, the charge carriers which have flowed into the conduction band of the diamond layer through the intermediate layer 4 from the doped layer 2, are locked in a kind of "well"—a so called "potential well".

Figure 5:
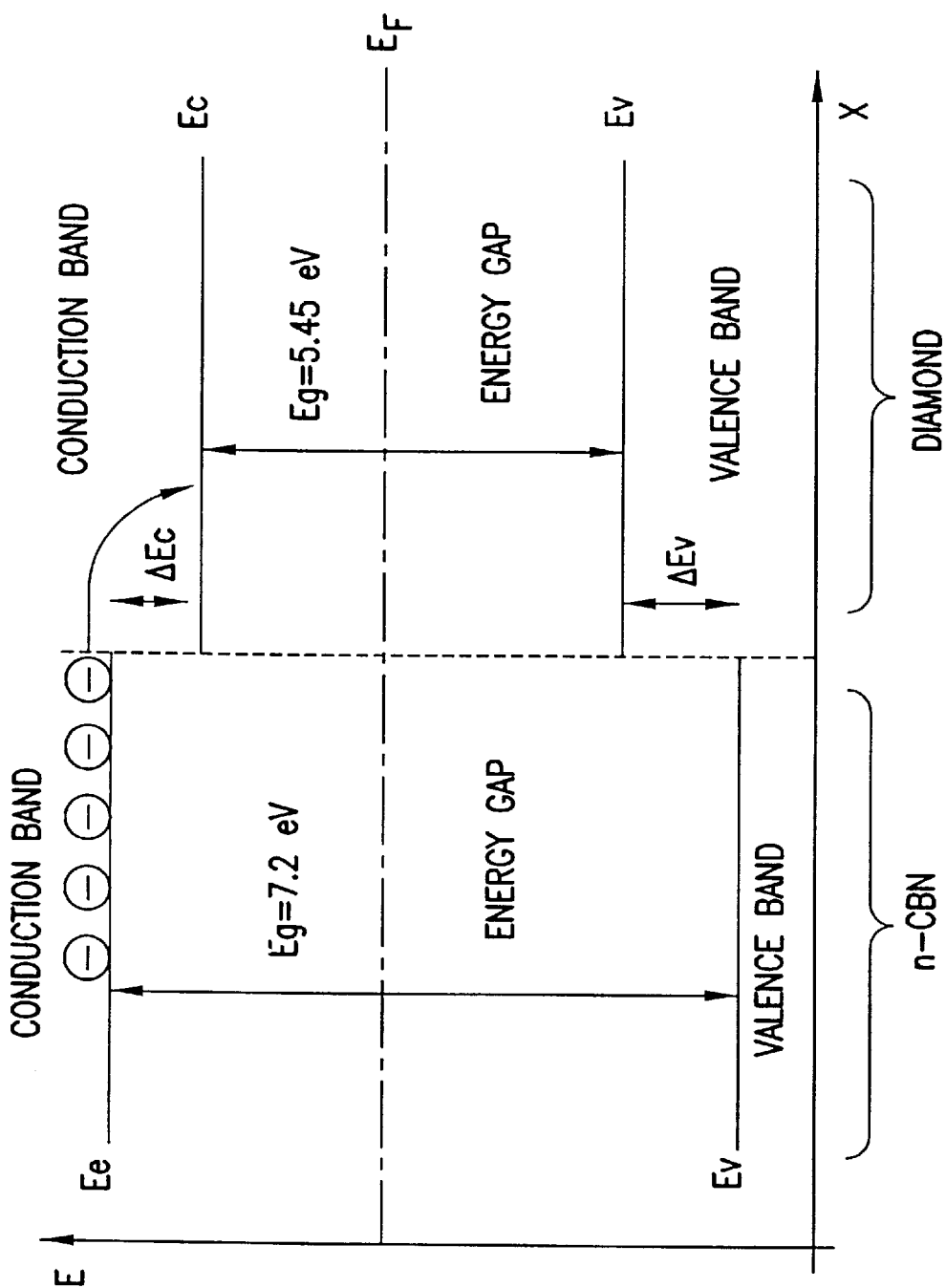
FIG. 5 shows a more detailed schematic illustration of the valence band and conduction band in the vicinity of the transition from a diamond layer to a C-BN layer.

This effect is illustrated in FIG. 5, which is a diagrammatic illustration showing the discontinuity of the energy bands at the transition between a C-BN layer and a diamond layer. The upper region represents the conduction band, the lower region represents the valence band and the intermediate region represents the energy gap $E_g$. On the left of the band diagram, the energy gap in the C-BN has a value of approximately 7.2 eV, while the energy gap of the adjoining diamond has a value of approximately 5.45 eV. (The common energy level at which the two band gaps align (broken line Ef) is the Fermi level.) The difference between the two band gaps is apportioned in roughly equal parts between the valence band (Ev) and the conduction band (Ec). The difference ΔEc with respect to the conduction band Ec forms the threshold for the negative charge carriers, which are thermally excited, to be able to pass back into the C-BN. At temperatures below 600° C. this difference ΔEc with respect to the conduction band Ec is very much larger than the thermal energy of the charge carriers, and accordingly they remain in the diamond layer.

Generally, in the conduction and valence bands in other structures, charge carriers move easily between individual energy levels, since the individual energy levels of the bands are so close together that they blend with one another, forming a "quasi-continuum" of possible energy levels, a so called "band". However, due to the thinness of the diamond layer 1 in the composite structure 10 of FIG. 1, (optimally only about 10 Ångströms to about 100 Ångströms), the width of the quantum well (which at most equals the width of the diamond layer plus that of the two intermediate layers 4) is very small. Therefore, the graph of the conduction band edge in the area of the diamond layer has discrete energy values for free charge carries of low energy, which energy levels do not conform to the quasi-continuum of a normal band. Thus, in the area of the potential well, the energy levels of the respective charge carriers differ substantially from one another, so that individual charge carriers can no longer alternate between the individual energy levels without a high energy input.

Figure 6:
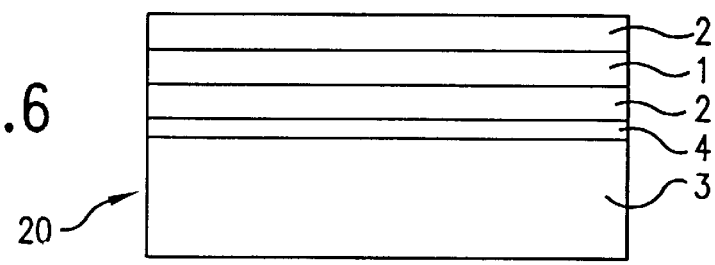
FIG. 6 is a composite structure in which the sequence of the layers is different from that of FIG. 1.

FIG. 6 shows a composite structure 20 which has a different arrangement of layers 1, 2 and 4 successively deposited on a growth substrate 3, consisting of doped or undoped, crystalline silicon. The intermediate layer 4, which is directly deposited on the growth substrate 3, is formed of a carbon/silicon alloy having a diamond-like or zinc blend-like alloy lattice in which the individual alloy atoms are statistically distributed, and the proportion of carbon atoms increases (while the proportion of the silicon atoms decreases) with increasing distance through the intermediate layer 4. As a result, the lattice constant of the intermediate layer 4 decreases from a value corresponding approximately to the lattice constant of the growth substrate 3 formed of silicon, toward a value that corresponds approximately to the lattice constant of cubic boronitride (C-BN), or an integral multiple thereof, to form a modified lattice match. This arrangement thus facilitates the deposit on the intermediate layer 4 of the n-doped layer 2, whose lattice constant differs from that of the growth substrate 3 of silicon by more than 50%. (In the case of direct deposition, the doped layer 2 of C-BN would be of unsatisfactory quality due to this large difference of lattice constants.)

An undoped diamond layer 1 is deposited on the doped layer 2 of C-BN, followed by another doped C-BN layer 2. Because of the same effects discussed previously with respect to FIG. 1, a band discontinuity is formed between the doped C-BN layer 2 and the diamond layer 1. Thus, charge carriers which are thermally and/or optically excited in the n-doped C-BN layer 2, can enter into the conduction band of the undoped diamond layer 1, with a reduction of their potential energy, so that the diamond layer 1 in the composite structure 20 also takes on the properties of an n-doped layer as noted above. In this case, it is advantageous that the doped C-BN layer 2, which provides the charge carriers (i.e., which has a doping action), is arranged directly adjacent the diamond layer 1 which collects these charge carriers in its potential well.

Figure 2:
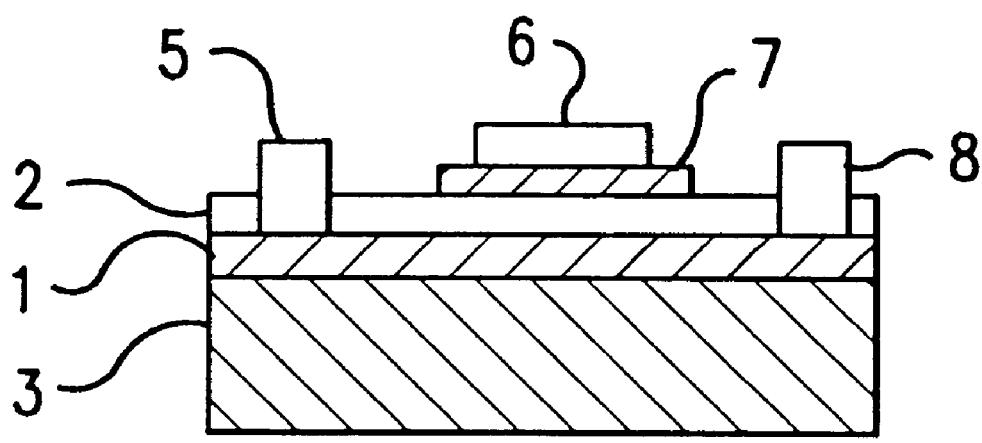
FIG. 2 is a schematic depiction of a field effect transistor which embodies the semiconductor composite structure according to the invention.

With the composite structure such as in the embodiment of FIG. 6, electronic components such as field-effect transistors (FET's), can be produced. FIG. 2 is an example of such an FET which embodies a semiconductor composite structure according to the invention. (Although this component may be fabricated using the transition layer arrangement referred to previously, it is omitted in FIG. 2 for the sake of simplicity.) As shown in the figure, a diamond layer 1 is deposited on the silicon growth substrate 3, with a layer of doped cubic boronitride 2 applied thereto. A metallic gate electrode 6 is applied to the cubic boronitride layer 2, separated by an isolation layer 7, which may be made of $SiO_2$. A metallic source electrode 8 is mounted in electrical contact with one end of the diamond layer 1, and a second metallic electrode 5 (a drain electrode) is mounted in electrical contact with the other end. With this structure, a flow of electric current between the source electrode 8 and the drain 5 through the diamond layer 1 can be regulated by the application of a control current to the gate electrode 6 in a manner which is known to those skilled in the art. As noted previously, the charge carriers in the undoped diamond layer which enable such a flow of current therein are provided by the doped cubic boronitride semiconductor layer adjacent thereto, according to the principles of the invention as disclosed herein.

Figure 7:
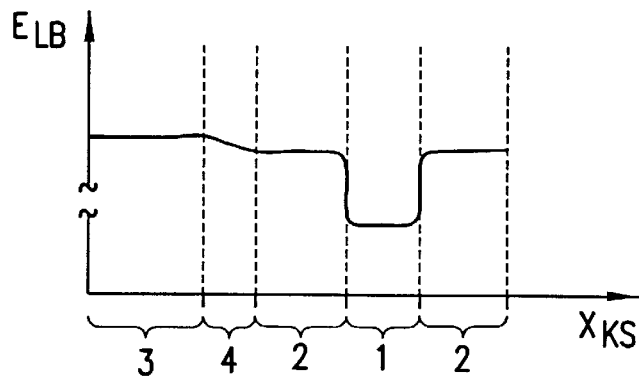
FIG. 7 is a representation of the conduction band edge of the composite structure of FIG. 6.

FIG. 7 is an idealized schematic depiction of the conduction band edge in the case of an n-doped semiconductor composite structure such as shown in FIG. 6. The layer thickness $x_{KS}$ of the composite structure 20 is plotted along the abscissa and the value $E_{LB}$ of the energy level of the conduction band edge is plotted along the ordinate. The conduction band of the growth substrate 3 has the highest energy level, followed by that of the adjacent intermediate layer 4 in which conduction band edge decreases to the value in the following doped layer 2. At the transition from the doped C-BN layer 2 to the diamond layer 1 the conduction band exhibits a band discontinuity, decreasing abruptly to the low-energy level of the diamond layer 1. At the edge surface between the diamond layer 1 and a subsequently applied second doped C-BN layer 2, the energy level of the composite structure 20 again has a band discontinuity, increasing abruptly to the value of the doped layer 2.

As is apparent from the representation of the idealized graph in FIG. 7 representing the conduction band edge in the area of the diamond layer 1, the charge carriers which have flowed out of the doped layer 2 into the conduction band of the diamond layer 1 are locked in a potential well which is essentially limited to the diamond layer, as compared with the one in FIG. 4. Thus, assuming that the diamond layers are of equal thickness in both embodiments, the potential well in FIG. 7, is substantially narrower. Under these conditions, the energy levels of charge carriers are very far apart. Because in FIG. 4 the width of the well spreading through the conduction bands of the intermediate layer 4 is nevertheless still small due to the small thickness of the diamond layer, the graph of the conduction band edge has discrete energy values at the area of the diamond layer 1 for free charge carriers. The advantage of the arrangement in FIG. 6, compared to that of FIGS. 1 and 4, is that for given diamond layer thickness, it provides a reduced quantum well width, thus achieving a greater separation of the discrete energy levels.

Figure 8:
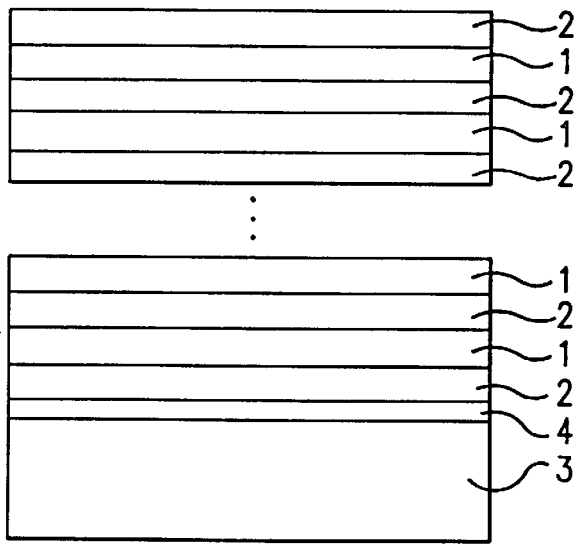
FIG. 8 is a composite structure with alternating doped layers and undoped diamond layers.

FIG. 8 shows still another embodiment of a composite structure 30 according to the invention, which has a multi-quantum well configuration, with undoped diamond layers 1 alternating with doped layers 2. The alternating doped layers 2 of n-doped C-BN and undoped diamond 1 are arranged on the growth structure 3. A Si—C alloy is applied as an intermediate layer 4 on the growth substrate 3, for the purpose of lattice matching in the same manner as described in connection with FIG. 6. The intermediate layer 4 is again followed by a doped layer 2 of C-BN, and then an undoped diamond coat 1. Due to the alternating layers as shown, the last undoped diamond layer 1 is covered on both sides by a doped C-BN layer 2. It is desirable for the thicknesses of the doped C-BN layers 2 and the undoped diamond layers each to amount to only about 10 Ångströms to about 100 Ångstroms, resulting in the idealized graph of the conduction band edge of the composite structure 30 represented by way of example in FIG. 9, with n-doping of the C-BN layers 2. Tunnel effects are also possible in this case on the basis of the distribution of the surface probability of a charge carrier between the individual wells.

Figure 9:
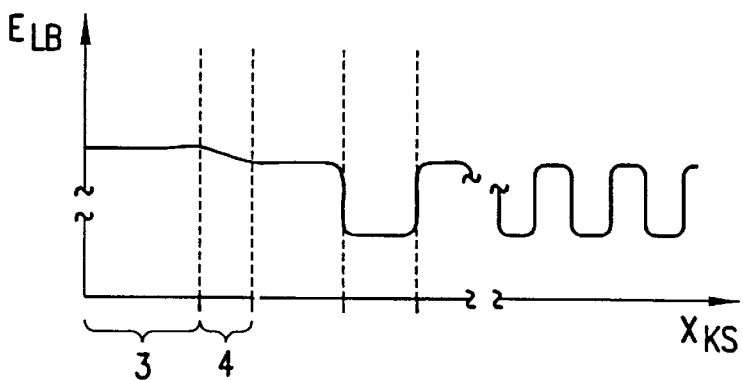
FIG. 9 is a diagram of the conduction band edge of the composite structure of FIG. 7.

Since, as already mentioned both the doped C-BN and the undoped diamond are deposited in very thin layers in the composite structure of FIG. 9, a band discontinuity with a negative rise is followed almost immediately by a band discontinuity with a positive rise at a boundary surface between an undoped diamond layer 1 and a doped C-BN layer 2. This results in a periodically alternating curve of the conduction band edge in the area of the alternating layers. If the "period" of the curve is very short, charge carriers can tunnel through the barrier represented by the curve of the conduction band boundary, since a matrix element of this transition has a value other than zero, and increases as voltage is applied. This phenomenon, which is referred to generally as resonant tunneling, occurs if the is energy levels in adjacent wells match in height due to slanting of the whole energy diagram caused by the voltage applied to the structure between 3 and 2.

With the composite structure 30 such as shown in FIG. 8, electronic components such as, for example, field-effect transistors (FET's) and tunnel diodes can be made. In particular, such a composite structure 30 is practical in light emitting diodes (LED's), since both positive and negative charge carriers are freely present in great density in the actually undoped diamond layer and can be recombined. To improve this procedure it may be desirable to induce mechanical stress within the composite structure 30 so as to increase the value for this matrix element associated with this transition. Mechanical stress may be applied, for example, by not fully adapting the lattice mismatch between the layers, and leaving a residual strain which affects the band structure. This technique is well known in Si-Ge systems.

It is also possible to provide a thin, undoped C-BN layer (not shown) between a doped C-BN layer 2 and an undoped, intrinsic diamond layer 1. The doping of the entire C-BN layer (that is, the doped and undoped C-BN layers together) thus varies nonlinearly across its thickness, so that the scatter effect of the majority charge carriers is reduced.

The embodiments of the composite structure 10, 20 and 30 represented in FIGS. 1, 6 and 8 have in common not only the formation of a potential well in the diamond layer 1, but also the receipt of the diamond layer or layers 1 of charge carriers on both sides.

In principle, it is also possible to charge the diamond layer with charge carriers from only one side, such as in the FET of FIG. 2, for example. In this case, the sequence of layers would be essentially as follows: doped layer/undoped diamond layer/undoped layer.

One possible process for the preparation of a composite structure 20 according to FIG. 6 by means of CVD process will be described below in connection with the combination of Si, CoCi2 or Si—C alloy, C-BN and diamond. (The composite structure 10 and 30 of FIGS. 1 and 8 can also be produced in the same manner, and thus they are not discussed separately.)

A silicon growth substrate 3 is installed in an MBE (molecular beam epitaxy) reactor and the reactor is evacuated. The pressure in the reactor should be less than $1*10^{-6}$ mbar. Pressures of less than $10^{-8}$ mbar are advantageous. The surface of the growth substrate 3 may be previously cleaned by wet chemical techniques, and once again inside the MBE reactor simply by heating the growth substrate 3 to a temperature above 700° C. Cleaning may also be effected using a plasma generated by means of radio waves or microwaves, in which case it is advantageous to heat the growth substrate 3 and/or to apply a predetermined electric potential to it. Plasma cleaning of the substrate may be effected, for example, at a pressure of 29 mbar, in an $H_2$ gas stream at a flow rate of 300 sccm, at a microwave power of 750 watts, with heating to 900° C. for a duration of 10 minutes.

If the composite structure is produced, for example, with a microwave supported MWCVD (microwave chemical vapor deposition), the cleaning of the surface of the growth substrate inside a MWCVD reactor of this type may also be effected by means of a process gas.

An intermediate layer 4 of crystalline cobalt disilicide ($CoSi_2$) or a Si—C alloy is to be applied to the silicon growth substrate 3. The intermediate layer 4 has a modified lattice adaptation to the growth substrate 3 and to the doped layer of cubic boronitride (C-BN) deposited thereon. In the case of an intermediate layer comprising a Si—C alloy, for example, pure silicon may be deposited on the growth side of the growth substrate from a solid silicon source, such as commercially available high purity (99.99%) silicon. The pure silicon is gradually replaced with carbon which is supplied from a solid carbon source, for example, commercially available high purity (99.99%) carbon. During the mixed deposition of carbon and silicon, a silicon-carbon alloy with a zinc blend-like or diamondlike alloy lattice in which the carbon atoms and the silicon atoms are statistically distributed, forms on the growth substrate 1. Deposition may be effected, for example, at a rate of 0.1 nm/s. The resulting layer thicknesses will typically range from 200 to 1000 nm.

In order that the lattice constant of the alloy lattice, which at the beginning of the alloy corresponds approximately to the lattice constant of the silicon growth substrate 3, can be decreased to the value of the lattice constant of the doped C-BN layer, for example, the proportion of silicon in the alloy is decreased while the proportion of carbon in the alloy (i.e., in the intermediate layer 4) is increased by appropriate adjustments of the respective solid sources as the thickness of the alloy layer increases. For example, the source may be regulated by closed-loop feedback in order to maintain a constant mass spectroscopy signal for carbon at 12 amu see Peter et al., *J. Vac. Sci. Tech.* A, Vol. 9, No. 6, pages 3061–63 (1991).

One process for producing such an intermediate layer 4 is as follows: A silicon atom beam is produced by evaporating solid silicon with an electron beam evaporator under ultra-high vacuum; a carbon atom beam is produced in a similar fashion. The ratio of Si to C can be varied from 0 to 1 by appropriately adjusting the two sources. A substrate of single crystal silicon is placed in the beam, and an alloy layer is deposited on the surface of the substrate. The lattice constant of the mixed layer varies in approximately linear manner in proportion to the carbon content (according to Vegard's Law). This can be measured by X-ray diffraction in layers produced in the foregoing manner.

If the gradient is selected small enough, the relaxation of the mixed layer (i.e., alloy layer), which is stressed relative to the silicon substrate, leads to a decrease in the lattice constant. And if this transition is sufficiently gentle, then the crystal structure will be retained.

It has proved to be advantageous to vary the composition of the alloy within a thickness range of approximately 0.1 $\mu$m to 2 $\mu$m. The solid sources consist of high purity silicon (99.99%) or high purity carbon (99.99%) High purity graphite is particularly advantageous. The deposition of the intermediate layer takes place at a reactor pressure of less than $10^{-6}$ mbar. The temperature of the growth substrate 3 amounts to between 200° C. and 1200° C., particularly between 450° C. and 750° C. During the growth, the surface of the growing intermediate layer 4 can additionally be subjected to a flux of low-energy ions, for example, ions having an energy of from about 0 to about 200 eV, in particular argon ions or nitrogen ions with an average energy of at most approximately 100 eV, in order to favorably influence the surface kinetics of the growing intermediate layer 4. A suitable flux of low energy ions may be produced, for example, with an ECR plasma source as described in Popov et al., *J. Vac. Sci. Tech.* A, Vol. 8, No. 3, pages 1009–12 (1990).

An n-doped C-BN layer 2 is deposited on the intermediate layer 4. For this purpose, hexagonal boronitride (BN), vaporized by means of a laser, is transported together with a nitrogen gas stream toward the growth substrate 3 and deposited as the C-BN layer 2 on the intermediate layer 4, which is heated to 600° C., for example.

The deposition of the diamond layer takes place in the presence of a hydrogen/methane gas stream which contains between 0.1 and 10% methane, at a temperature between 200° C. and 900° C., preferably above 600° C. A suitable deposition procedure is disclosed, for example, in published German Patent Application No. DE 42 33 085. The starting crystal forming phase can be promoted by the application of a bias voltage between +50 V to −300 V, in particular −150 V.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A composite structure for an electronic component, comprising:

a growth substrate; and a plurality of doped non-diamond layers formed from boronitride;

a plurality of undoped diamond layers having a thickness from 0.001 $\mu$m to 0.5 $\mu$m, and an intermediate layer disposed between each doped non-diamond layer and diamond layer, said intermediate layer comprising an alloy material having a lattice structure selected from the group consisting of a diamond structure, a zinc blend structure and a calcium fluoride structure, whereby charge carriers can be drawn from a doped non-diamond layer through the intermediate layer into an undoped diamond layer, wherein:

said undoped diamond layers and said doped non-diamond layers have respective conduction band energy level edges which differ from each other, whereby a band discontinuity exists between said respective conduction band energy level edges in a vicinity of at least a transition interface between said undoped diamond layers and said doped non-diamond layers, so that charge carriers from said doped non-diamond layers which are excited optically or thermally can be conducted, with a reduction in their potential energy, into a valence band or a conduction band of the undoped diamond layers;

each undoped diamond layer has a band discontinuity at first and second transition interfaces thereof;

a configuration of said respective conduction band energy level edges in said undoped diamond layers and said doped layers forms a plurality of potential wells, with a quantizing effect on energy levels of said charge carriers conducted into the undoped diamond layers.

2. Composite structure according to claim 1 comprising an alternating series of doped non-diamond layers and undoped diamond layers.

3. Composite structure according to claim 1 wherein the growth substrate has an orientation of (1, 0, 0) in Miller indices, and comprises a material selected from the group consisting of silicon and as GaAs.

4. Composite structure according to claim 1 wherein the growth substrate of the composite structure is not doped.

5. Composite structure according to claim 1 wherein at least one non-diamond layer is n-doped.

6. Composite structure according to claim 1 further comprising:

an intermediate layer disposed between the growth substrate and a non-diamond layer;

said intermediate layer comprising an alloy with alloy atoms arranged statistically within an alloy lattice, whereby a lattice constant of said intermediate layer varies across a thickness thereof between an integral multiple of a lattice constant of the growth substrate and an integral multiple of a lattice constant of the non-diamond layer, and having a crystal lattice which is substantially similar to a crystal lattice of the non-diamond layer.

7. Composite structure according to claim 1 wherein the intermediate layer comprises a silicon-carbon alloy having a carbon content which increases within the intermediate layer with increasing distance from a lower face of the layer, and whose silicon content correspondingly decreases, wherein said alloy has an alloy lattice structure selected from the group consisting of a diamond structure and a zinc blend structure.

8. Composite structure according to claim 1 wherein a thickness of the undoped diamond layers is between 0.001 and 0.1 $\mu$m.

9. Composite structure according claim 1 wherein the thickness of the diamond layer is approximately equal to a Fermi wavelength of charge carriers in the diamond layer.

10. A composite structure for an electronic component comprising:

a growth substrate; and at least one undoped diamond layer on said growth substrate, deposited between doped layers adjacent thereto, wherein:

said undoped diamond layer has a thickness which is in a range of 0.001 to 0.5 $\mu$m; and said doped layers comprise a material which has a conduction band energy level lower limit which is greater than a lower limit of a conduction band energy level edge of said undoped diamond layer.

11. Composite structure according to claim 10 wherein said doped layers comprise doped cubic boronitride.

* * * * *